US009949394B2

(12) United States Patent
Kamoshida et al.

(10) Patent No.: US 9,949,394 B2
(45) Date of Patent: Apr. 17, 2018

(54) MOTOR VEHICLE INTERNAL COMBUSTION ENGINE CONTROL APPARATUS

(71) Applicant: Hitachi Automotive Systems, Ltd., Hitachinaka-shi, Ibaraki (JP)

(72) Inventors: Masaru Kamoshida, Hitachinaka (JP); Yoshinori Wakana, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 25 days.

(21) Appl. No.: 15/128,120

(22) PCT Filed: Feb. 17, 2015

(86) PCT No.: PCT/JP2015/054198
§ 371 (c)(1),
(2) Date: Sep. 22, 2016

(87) PCT Pub. No.: WO2015/146366
PCT Pub. Date: Oct. 1, 2015

(65) Prior Publication Data
US 2017/0172006 A1 Jun. 15, 2017

(30) Foreign Application Priority Data
Mar. 25, 2014 (JP) ................................. 2014-001488

(51) Int. Cl.
*H05K 5/06* (2006.01)
*H05K 5/00* (2006.01)

(52) U.S. Cl.
CPC ............. *H05K 5/06* (2013.01); *H05K 5/0026* (2013.01); *F02D 2400/18* (2013.01)

(58) Field of Classification Search
CPC ...... H05K 5/0213; H05K 5/0052; H05K 5/06; H05K 5/065; H05K 5/03; H05K 5/064; F02D 2400/18
See application file for complete search history.

(56) References Cited

U.S. PATENT DOCUMENTS 7,144,275 B2 * 12/2006 Iida ...................... H05K 5/0069
439/587
7,561,435 B2 * 7/2009 Kamoshida .......... H05K 5/0052
174/50.5

(Continued)

FOREIGN PATENT DOCUMENTS

EP       2 034 811 A2    3/2009
JP       2000-323865 A   11/2000

(Continued)

OTHER PUBLICATIONS

International Search Report (PCT/ISA/210) issued in PCT Application No. PCT/JP2015/054198 dated May 19, 2015 with English translation (six pages).

(Continued)

*Primary Examiner* — Long T Tran
(74) *Attorney, Agent, or Firm* — Crowell & Moring LLP

(57) ABSTRACT

The purpose of the present invention is to provide a motor vehicle internal combustion engine control apparatus which is constructed as a waterproof structure capable of having a long life while minimizing an increase in surface area of a case and a cover, thereby enabling miniaturization, decrease in cost, and increase in reliability to be satisfied. The motor vehicle internal combustion engine control apparatus is equipped with a substrate, a connector, and a case and cover which enclose the substrate, a waterproofing adhesive being disposed at a junction part between the cover and the case. Recessed portions are disposed at the junction part between the case and the cover. The sidewalls of one of the recessed (Continued)

portions are inserted into the other of the recessed portions to form a gap which is folded a plurality of times between the case and the cover and extends between the inside and the outside of the case and cover, said gap being formed so that the size of the gap on the outer side is formed to be larger than the size of the gap on the inner side. The gap is configured to be fluid-tight by the waterproofing adhesive filled in the gap.

7 Claims, 5 Drawing Sheets

(56) References Cited

U.S. PATENT DOCUMENTS

| | | | | |
|---|---|---|---|---|
| 7,667,973 | B2* | 2/2010 | Shinoda | H05K 5/0047 |
| | | | | 174/50 |
| 8,699,231 | B2* | 4/2014 | Shinoda | H05K 5/0047 |
| | | | | 174/520 |
| 8,854,827 | B2* | 10/2014 | Tanaka | H05K 5/0052 |
| | | | | 174/259 |
| 2008/0002377 | A1* | 1/2008 | Kamoshida | H05K 5/0052 |
| | | | | 361/752 |
| 2009/0068862 | A1 | 3/2009 | Honda | |
| 2011/0211311 | A1* | 9/2011 | Shinoda | H05K 5/0047 |
| | | | | 361/694 |
| 2012/0069532 | A1 | 3/2012 | Azumi et al. | |
| 2012/0127677 | A1* | 5/2012 | Wakana | H05K 5/0069 |
| | | | | 361/752 |
| 2012/0320544 | A1 | 12/2012 | Ohhashi et al. | |
| 2013/0120943 | A1 | 5/2013 | Tamura et al. | |

FOREIGN PATENT DOCUMENTS

| | | |
|---|---|---|
| JP | 2001-36262 A | 2/2001 |
| JP | 2009-49215 A | 3/2009 |
| JP | 2009-70855 A | 4/2009 |
| JP | 2012-69611 A | 4/2012 |
| JP | 2003-151676 A | 1/2013 |
| JP | 2013-4759 A | 1/2013 |
| JP | 2013-105766 A | 5/2013 |

OTHER PUBLICATIONS

Japanese-language Written Opinion (PCT/ISA/237) issued in PCT Application No. PCT/JP2015/054198 dated May 19, 2015 (four pages).

* cited by examiner

MOTOR VEHICLE INTERNAL COMBUSTION ENGINE CONTROL APPARATUS

TECHNICAL FIELD

The present invention relates to a waterproof structure of a control apparatus which controls a motor vehicle internal combustion engine for proper operation.

BACKGROUND ART

It is conventionally common that an internal combustion engine control apparatus has a waterproof structure from waterproofness, dust resistance and rust prevention viewpoints. Mainstream waterproof structures include a waterproofing structure having tightening force by sandwiching a molded elastic member between a case and a cover, and a waterproof structure having a waterproofing adhesive applied and cured for fluid-tight sealing. As a market demand concerning waterproofness, a demand for a long life gets stronger, so that long-term reliability of the waterproof structure needs to be ensured.

Although a long life can be achieved by simply adopting material or treatment of high corrosion resistance, a resulting control apparatus is problematically very expensive. Accordingly, adopting a structure having a life extended in relation to creeping corrosion by increasing a part to which the waterproofing adhesive is adhered has become mainstream to meet the demand at low cost. In cases where the adhesive part is formed simply of a plane surface, the adhesive part enlarges, thus resulting in a control apparatus increased in size. For this reason, a structure securing an increased adhesive length by making an adhesive part uneven is adopted.

Structures such as described in Japanese Patent Unexamined Publication. No. 2000-323865 (PTL 1) and Japanese Patent Unexamined Publication No. 2013-105766 (PTL 2) are known as waterproof structures of control apparatuses in a manufacturing process of the control apparatus of PTL 1, allowances are increased for variations in the amount of adhesive applied and varying application patterns, so that a highly reliable electronic circuit case of stable quality provided (refer to paragraph 0008). This electronic circuit case is assembled by fixing a cover to a housing with an internally mounted electronic circuit substrate by bonding (refer to paragraphs 0013 to 0015). For this reason, the housing includes a fully circumferential groove in which an adhesive is filled and the cover is engaged, and at a part of the fully circumferential groove, an adjacent groove reduced in wall height. The adhesive overflowing the fully circumferential groove is allowed to flow into the adjacent groove, so that the amount of adhesive to be applied is set to be slightly larger than a minimum set amount, thereby preventing an adhesive shortage (refer to paragraphs 0016 to 0017). In the control apparatus of PTL 2, a case (housing) is constructed of a base and a cover that cover respective sides of an electronic circuit substrate, and a lid covering an opening defined by the base and the cover (refer to paragraphs 0013). The base is formed with a groove along its four sides, and a sealant is applied to the groove. When a projection provided to the cover is in the process of being inserted in the groove, the sealant is structurally pushed into a gap between the projection and a groove surface (refer to paragraphs 0014 to 0016 and FIGS. 2(a) to 2(c)). A structure described in another embodiment has a jetty formed inside a projection provided to a cover, and a cover-side groove defined by the projection and the jetty is engaged with a base-side groove (refer to paragraph 0023 and FIGS. 4(a) and 4(b)). In this structure, a sealant also flows into an inner periphery of the projection, thus resulting in an increased adhesive distance, and consequently, adhesive strength and sealability between the cover and a base increase.

CITATION LIST

Patent Literatures

PTL 1: Japanese Patent Unexamined Publication No. 2000-323865
PTL 1: Japanese Patent Unexamined Publication No. 2013-105766

SUMMARY OF INVENTION

Technical Problem

A control apparatus is constructed as a waterproof structure by providing a lower structure case (the above-mentioned housing or base) with a groove, applying a waterproofing adhesive to the groove and fitting a protruding part (a peripheral part of the cover or the projection) provided to an upper structure cover (the above-mentioned cover). In such a structure, because the adhesive or the sealant is filled in a narrow space in the vicinity of the protruding part of the structure cover, it cannot be said that sufficient consideration is given to a longer life demanded by a market.

An object of the present invention is to provide a motor vehicle internal combustion engine control apparatus which is constructed as a waterproof structure capable of having a long life while minimizing increases in surface area of a case and a cover, thereby satisfying miniaturization, decrease in cost, and increase in reliability.

Solution to Problem

A motor vehicle internal combustion engine control apparatus includes: a substrate formed with an electronic circuit for controlling a motor vehicle internal combustion engine; a connector for connecting the electronic circuit formed on the substrate to an external device; a case for covering one substrate surface of the substrate; a cover for covering the other substrate surface of the substrate; and a waterproofing adhesive adhering to a junction part between the cover and the case, wherein the case and the cover each include at least one recessed portion at the junction part, wherein a sidewall of one of the recessed portions is inserted into the other recessed portion to form a gap folded a plurality of times between the case and the cover, wherein the gap extends between an inside, which is separated from an outside by the case and the cover, and the outside and is formed to have a larger gap size near the outside as compared with a gap size thereof near the inside, and wherein the gap is filled with the waterproofing adhesive to be fluid-tight.

Advantageous Effects of Invention

According to the invention, a long adhesive distance can be ensured by changing the shape of an adhesive part between the case and the cover, whereby the increases in surface area of the case and the cover can be minimized, and the long life can be achieved for the waterproof structure. Accordingly, a demand for miniaturization of control apparatuses can be met, a low-cost cover and a low-cost case can be adopted, and long-term waterproof performance can be ensured in a severe environment.

Problems, structures and effects other than those described above are disclosed in the description of the following exemplary embodiments.

DESCRIPTION OF EMBODIMENTS

An exemplary embodiment of the present invention is described hereinafter with reference to the accompanying drawings. The embodiments described below are each intended for a control apparatus used for controlling a motor vehicle internal combustion engine but can be applied to a variety of control apparatuses not limited to the motor vehicle internal combustion engine. However, structures described in the following embodiments are suitable for use as motor vehicle internal combustion engine control apparatuses required to have long-term reliability in a severe environment.

First Exemplary Embodiment

Figure 1:
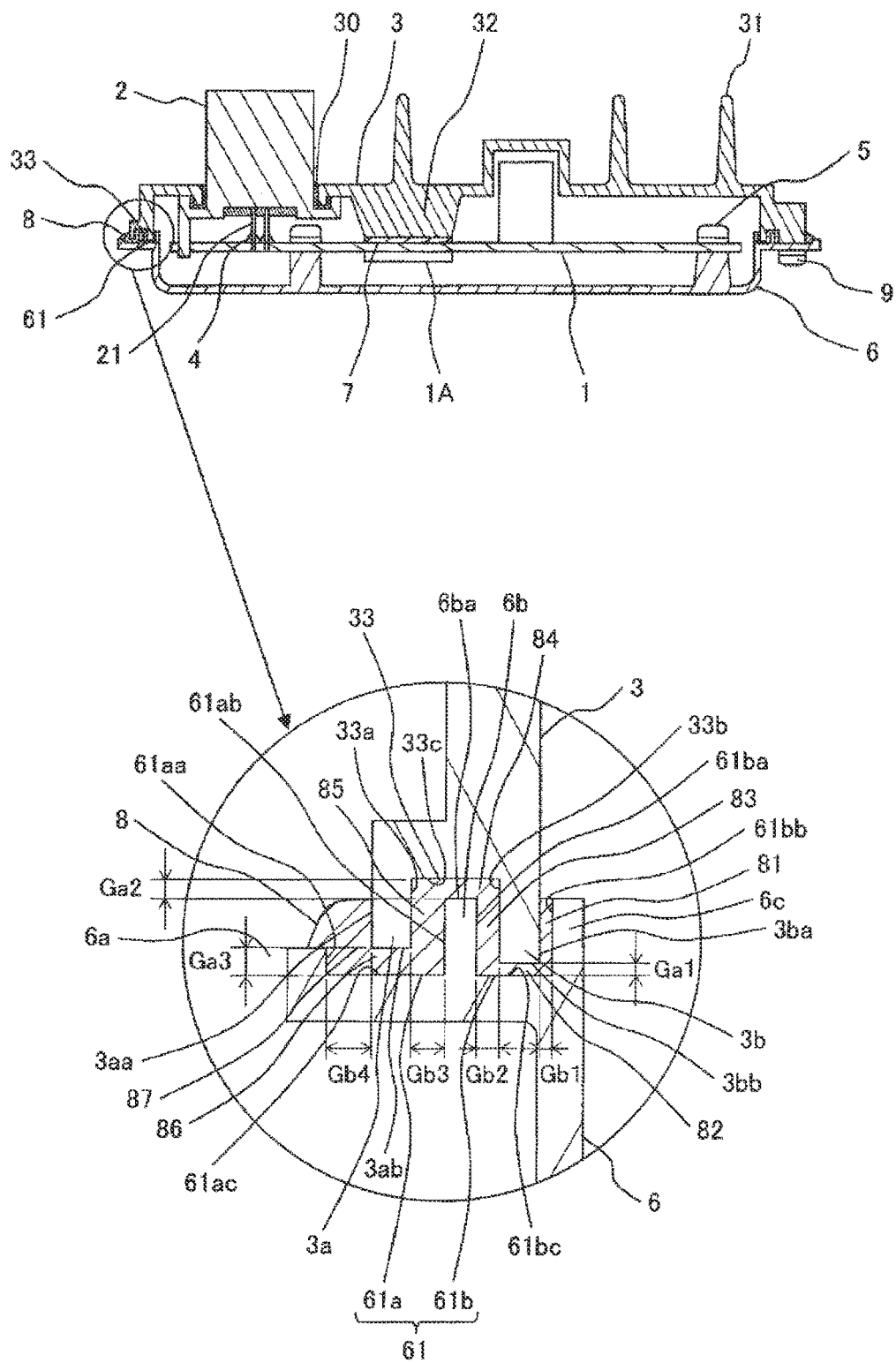
FIG. 1 is a sectional view illustrating a structure in accordance with a first exemplary embodiment of the present invention.

FIG. 1 is a sectional view illustrating the structure in accordance with the first exemplary embodiment of the present invention. A substrate 1 having a circuit, which is formed of an electronic component 1A and a pattern for electrically controlling a device (not shown), is connected by solder 4 to a terminal 21 of a connector 2 that serves as a plug seat for electrical connection with the outside. The substrate 1 and the connector 2 mounted to the substrate 1 are fixed to a cover 6 by a screw 5 so that a substrate surface of the substrate 1 is covered to face an inner surface of the cover 6. The screw 5 is used for fixing with respect to a case 3 having a heat radiating fin 31. After the substrate 1 is mounted to the cover 6, the cover 6 is fixed to the case 3 by a screw 9 so that the other substrate surface of the substrate 1 is covered to face an inner surface of the case 3. Here, a heat transfer member 7 is mounted to a heat transfer boss 32 provided to the case 3, and through this heat transfer member 7, heat of the electronic component 1A is transferred to the case 3. The cover 6 and the case 3 are mounted to each other so that an end of the connector 2 that is coupled to a plug connecting with a cable projects outward from an opening 3o of the case 3 for exposure.

For ensuring waterproofness, dust resistance, and rust preventing capacity, a waterproofing adhesive 8 is disposed between the case 3 and the cover 6. At a junction part between the case 3 and the cover 6, where the waterproofing adhesive 8 is disposed, a waterproof structural section is formed. The case 3 has a recessed portion 33 at its waterproof structural part. Similarly, the cover 6, which is another structural member, has a recessed portion 61 at its waterproof structural part. The waterproofing adhesive 8 is applied to fill up a gap formed by combining these recessed portions 33, 61. The waterproof structural section is formed at the junction part (mating faces) of the case 3 and the cover 6 and constructed of the recessed portion 33 of the waterproof structural part of the case 3, the recessed portion 61 of the waterproof structural part of the cover 6, and the waterproofing adhesive 8.

The case 3 has the one recessed portion 33 at the junction part with the cover 6 while the cover 6 has two recessed portions 61a, 61b in double row relationship at the junction part with the case 3. Two sidewalls 3a, 3b defining the recessed portion 33 of the case 3 are inserted separately into the respective recessed portions 61a, 61b of the cover 6 that have the double row relationship. The waterproofing adhesive 8 is filled over the entire range of the gap where an inner surface of the recessed portions 61a, 61b of the cover 6 that have the double row relationship faces a face of the case 3. Here, the inner surface of the recessed portions 61a, 61b having the double row relationship includes a sidewall face 61aa of a sidewall 6a, a sidewall face 61ab of a partition wall 6b, a bottom face 61ac, a sidewall face 61ba of the partition wall 6b, a sidewall face 61bb of a sidewall 6c, a bottom face 61bc, and a leading end face 6ba of the partition wall 6b. Although the leading end face 6ba of the partition wall 6b is positioned on an outer side of cavities of the recessed portions 61a, 61b, the partition wall 6b is positioned inside the recessed portion 61 as a part separating the recessed portions 61a, 61b, thus having faces which are components of the inner surface of the recessed portions 61a, 61b having the double row relationship (that is to say, the recessed portion 61). Hereinafter, the description goes into detail.

The recessed portion 33 of the waterproof structural part of the case 3 is formed of a sidewall face 33a of the sidewall 3a, a sidewall face 33b of the sidewall 3b, and a bottom face 33c and has the form of a groove running along a peripheral part (the junction part) of the case 3, where the case 3 is joined to the cover 6. The recessed portion 61 of the waterproof structural part of the cover 6 is formed in the form of the recessed portions 61a, 61b which are defined by the sidewall 6a, the partition wall 6b, and the sidewall 6c, thus having the double row relationship. The recessed portion 61a is formed of the sidewall face 61aa of the sidewall 6a, the sidewall face 61ab of the partition wall 6b, and the bottom face 61ac and has the form of a groove running along a peripheral part (the junction part) of the cover 6, where the cover 6 is joined to the case 3. The recessed portion 61b is formed of the sidewall face 61ba of the partition wall 6b, the sidewall face 61bb of the sidewall 6c, and the bottom face 61bc and has the form of a groove running along the peripheral part (the junction part) of the cover 6, where the cover 6 is joined to the case 3. The recessed portion (groove) 61a is separated from the recessed portion (groove) 61b by the partition wall 6b and formed along an outer periphery of the recessed portion (groove) 61b.

The waterproof structural section has, in a direction from its inner periphery to its outer periphery, a first gap 81 formed between the sidewall face 61bb the cover 6 and an inner peripheral sidewall face 33ba of the sidewall 3b of the case 3, a second gap 82 formed between a leading end face 3bb of the sidewall 3b and the bottom face 61bc of the recessed portion 61b, a third gap 83 formed between the outer peripheral sidewall face 33b of the sidewall 3b and the inner peripheral sidewall face 61ba of the partition wall 6b, a fourth gap 84 formed between the leading end face 6ba of the partition wall 6b and the bottom face 33c of the recessed portion 33, a fifth gap 85 formed between the outer peripheral sidewall face 61ab of the partition wall 6b and the inner peripheral sidewall face 33a of the sidewall 3a, a sixth gap 86 formed between a leading end face 3ab of the sidewall 3a and the bottom face 61ac of the recessed portion 61a, and a seventh gap 87 formed between an outer peripheral sidewall face 33aa of the sidewall 3a and the inner peripheral sidewall face 61aa of the sidewall 6a.

These first to seventh gaps 81 to 87 form the gap having a labyrinth structure (a labyrinth seal) and are filled with the waterproofing adhesive 8. The gaps 81 to 87 of the labyrinth structure form the gap (zigzag gap) folded a plurality of times. The gaps 81 to 87 collectively provide communication between an internal space defined by the case 3 and the cover 6 and the outside, thus extending in combination between the internal space defined by the case 3 and the cover 6 and the outside. By being filled with the waterproofing adhesive 8, the gaps 81 to 87 are structurally fluid-tight.

Preferably, the first, third, fifth and seventh gaps gradually increase in size in the order named. In other words, a relationship of $Gb1<Gb3<Gb5<Gb7$ is formed. Alternatively, it is preferable that all the first to seventh gaps gradually increase in size in this order. In other words, a relationship of $Gb1<Gb2<Gb3<Gb4<Gb5<Gb6<Gb7$ is formed. The former relationship means that among only the gaps each formed between the sidewalls, the gap on an outer peripheral side of the control apparatus is formed to be larger in size than the gap on an inner peripheral side of the control apparatus, while the latter relationship means that among the gaps each formed between the sidewalls and the gaps each formed between the leading end face of the sidewall and the bottom face of the recessed portion, the gap on the outer peripheral side of the control apparatus is formed to be larger in size than the gap on the inner peripheral side of the control apparatus.

To realize the above-mentioned gap sizes, respective widths of the grooves in the present embodiment are set such that the recessed portion 33 is larger in groove width than the recessed portion 61b while the recessed portion 61a is larger in groove width than the recessed portion 33.

In this embodiment, when the recessed portion 33 of the case 3 is mounted to the recessed portion 61 of the cover 6 so as to form the above-mentioned first to seventh gaps after application of the adhesive to the recessed portion 61b of the cover 6, with the gap sizes set as described above, the adhesive is pushed in a direction in which the gap sizes increase. In other words, the adhesive is pushed in the direction from the inner peripheral side to the outer peripheral side, that is, from the recessed portion 61b to the recessed portion 61a of the cover 6, thus filling up each of the gaps. The adhesive eventually overflows the gap on the outer peripheral side and piles up (in the form of a bank), whereby the junction part (the waterproof structural section) formed between the case 3 and the cover 6 is prevented from being formed with another recessed portion and thus structurally, hardly allows water and others to accumulate.

In this embodiment, the gaps 87 to 81 are formed along the entire range of from the outer peripheral side to the inner peripheral side in the part where the case 3 and the cover 6 face each other, whereby a long adhesive distance can be obtained along the direction connecting the outer and inner peripheral sides of a casing (housing) formed of the case 3 and the cover 6. In this way, increased adhesive strength and long-term waterproof performance can be ensured. Such performance can be achieved by the labyrinth structure enabled by the recessed portions 33, 61, so that increases in surface area of the case 3 and the cover 6 can be minimized, thus contributing to miniaturization of the casing.

Second Exemplary Embodiment

Figure 2:
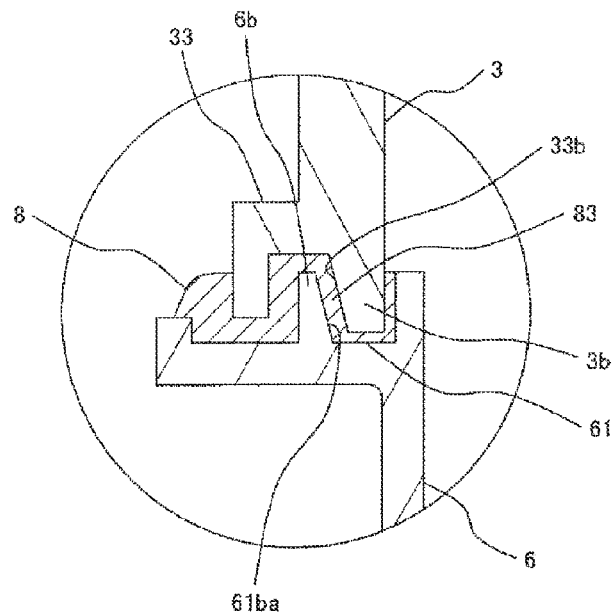
FIG. 2 is a sectional view illustrating a structure in accordance with a second exemplary embodiment of the invention.

FIG. 2 is a sectional view illustrating the structure in accordance with the second exemplary embodiment of the invention. A modification of FIG. 1 (the first embodiment) is made in that an inner peripheral sidewall face 61ba of a sidewall 6b defining a recessed portion 61b and an outer peripheral sidewall face 33b of a sidewall 3b defining a recessed portion 33 are slanted in groove width directions of the recessed portions 33, 61b so that a third gap 83 has its outer peripheral end positioned externally of its inner peripheral end. In other words, the third gap 83 is slantingly provided. Except for this, the structure is similar to that of the first embodiment. According to the present embodiment, when the recessed portion 33 of a case 3 and a recessed portion 61 of a cover 6 are combined, a waterproofing adhesive 8 present in a gap is easily pushed out of a control apparatus. Although only the third gap 83 is slantingly provided in this embodiment, of at least two gaps among first to seventh gaps, the gap positioned externally of the other gap in the control apparatus may be slanted at a greater angle.

In the present embodiment, among a sidewall 3a and the sidewall 3b of the recessed portion 33 of the cover 6 and the sidewalls 6a, 6b, 6c of the recessed portion 61 of the case 3, the two sidewalls have respective mutually facing sidewall faces slanted in the same direction. In this case, the direction in which those sidewall faces are slanted is such a direction that in a path of the gaps 81 to 87 that extends between the inside, which is separated from the outside by the case 3 and the cover 6, and the outside for connection therebetween, the gap defined by those sidewall faces has its outer end positioned away from the inside (an internal space), as compared with its inner end.

Third Exemplary Embodiment

Figure 3:
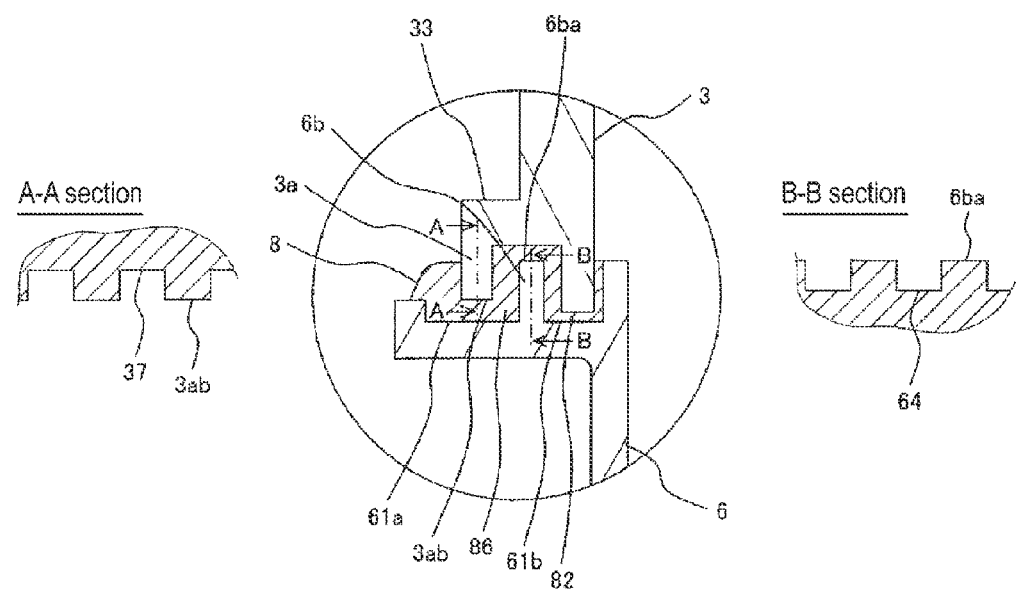
FIG. 3 is a sectional view illustrating a structure in accordance with a third exemplary embodiment of the invention.

FIG. 3 is a sectional view illustrating the structure in accordance with the third exemplary embodiment of the invention. Modifications of FIG. 1 (the first embodiment) are made in that a leading end face (lower end face) 3ab of a sidewall 3a of a case 3 has notches (forming an uneven shape) 37, and a leading end face (upper end face) 6ba of a sidewall 6b of a cover 6 has notches (forming an uneven shape) 64. In the present embodiment, both the sidewalls 3a and 6b have the notches; however, the notches may be provided for either of the sidewalls 3a, 6b. Except for the above, the structure is similar to that of the first embodiment. In this embodiment, when the cover 6 and the case 3 are combined, a waterproofing adhesive 8 present in a gap is pushed toward an outer periphery through the notches (forming the uneven shape) 37 or 64, thereby flowing into an outer peripheral gap with ease.

Either one or both of the notches (forming the uneven shape) 37 and the notches (forming the uneven shape) 64 of this embodiment may be applied to the first and second embodiments. Alternatively, the first to third embodiments may be combined.

Fourth Exemplary Embodiment

Figure 4:
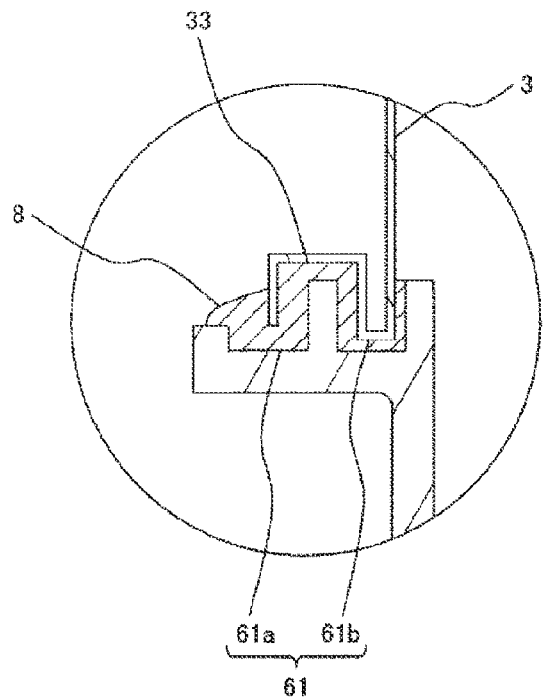
FIG. 4 is a sectional view illustrating structure in accordance with a fourth exemplary embodiment of the invention.

FIG. 4 is a sectional view illustrating the structure in accordance with the fourth exemplary embodiment of the invention. A modification of FIG. 1 (the first embodiment) is made in that a case 3 is molded by press working in this embodiment. Instead of the case 3, a cover 6 may be molded by press working. In other words, either one of the case 3 and the cover 6 is molded by press working. Accordingly, the case 3 or the cover 6 needs to have a tapped hole for fixing a substrate 7. In cases where both the case 3 and the cover 6 are molded by press working, the tapped hole for fixing the substrate 7 passes through to the outside, which is not preferable in terms of fluid tightness. Except for the above, the structure is basically similar to that of the first embodiment and has first to seventh gaps 81 to 87 and recessed portions 33, 61 that are set in a similar manner. Either one or both of the notches (forming the uneven shape) 37 and the notches (forming the uneven shape) 64 of this embodiment may be applied to the second or third embodiments. Alternatively, at least two of the first to fourth embodiments may be combined.

Fifth Exemplary Embodiment

Figure 5A:
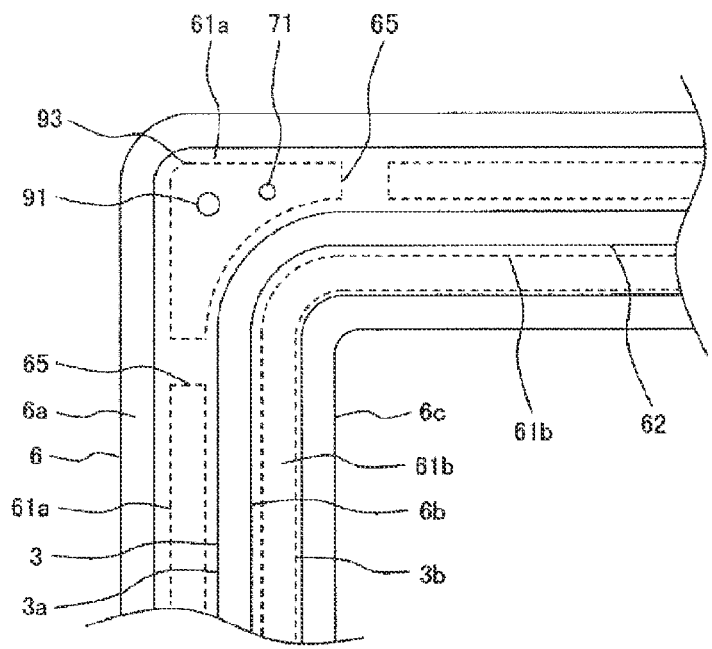
FIG. 5A is a plan view of a cover, illustrating a periphery of a screw fastening part which fixes a case and the cover in accordance with a fifth exemplary embodiment of the invention.
Figure 5B:
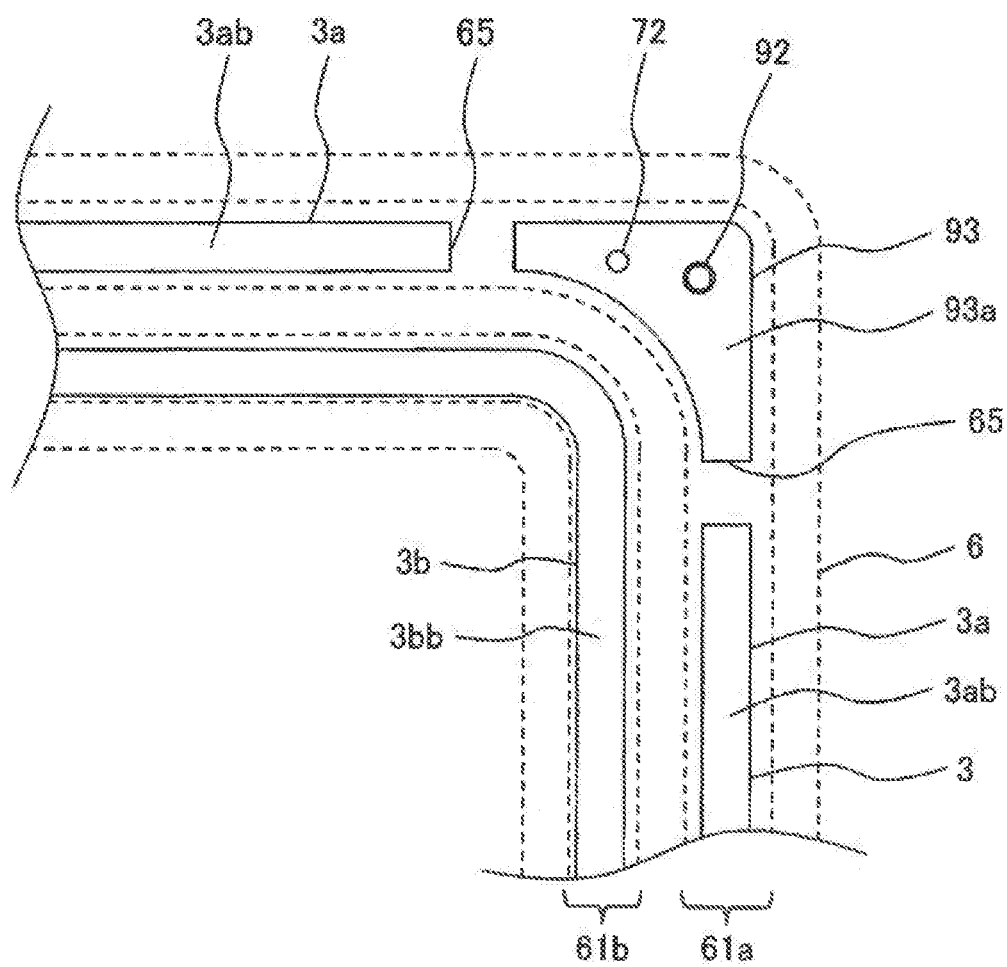
FIG. 5B is a plan view of the case, illustrating the periphery of the screw fastening part which fixes the case and the cover in accordance with the fifth embodiment of the invention.

FIG. 5A is a plan view of a cover 6 shown by solid lines, illustrating a periphery of a fastening part 93 for a screw 9 which fixes a case 3 and the cover 6 in accordance with the fifth exemplary embodiment of the invention. FIG. 5B is a plan view of the case 3 shown by solid lines, illustrating the periphery of the fastening part 93 for the screw 9 which fixes the case 3 and the cover 6 in accordance with the fifth embodiment of the invention. In a groove (waterproof structural section) formed by combining recessed portions 33, 61, an outer peripheral groove 61a and an inner peripheral groove 61b are formed, and the fastening part 93 for the screw 9 is disposed between the grooves 61a, 61b. Notches 65 are formed on both sides of the fastening part 93 for the screw 9, respectively so as to connect the grooves 61a, 61b (for communication therebetween). The notches 65 are thus formed as parts for communication between the grooves 61a, 61b.

In the present embodiment, the fastening part 93 is provided along a sidewall 3a of a recessed portion 33 of the case 3. However, the cover 6 and the case 3 can have their recessed portions 61, 33 exchanged so that the cover is formed to have the recessed portion 33 while the case 3 is formed to have the recessed portion 61. In such a case, the fastening part 93 is provided along a sidewall of the recessed portion of the cover 6. The notch 65 may be provided in one or more positions on both or either one of the sides of the fastening part 93 to disconnect the sidewall along which the fastening part 93 is provided.

Differently from other portions, a portion of the groove 61a that is on an outer periphery of the fastening part 93 for the screw 9 requires application of a waterproofing adhesive 8, so that the notches 65 are provided to ensure connection between the portion of the groove 61a that is on the outer periphery of the fastening part 93 for the screw 9 and a portion of the groove 61a that is on an inner periphery of the fastening part 93. Hereinafter, the description goes into detail.

Before the case 3 and the cover 6 are combined, the waterproofing adhesive (sealant) 8 is applied to the recessed portion 61b in advance. When the case 3 and the cover 6 are mounted to each other, the waterproofing adhesive 8 in the recessed portion 61b is pushed by a sidewall 3b of the case 3 toward the recessed portion 61a through a third gap 83 and a fourth gap 84. The waterproofing adhesive 8 pushed into the recessed portion 61a overflows a seventh gap 87 through a fifth gap 85 and a sixth gap 86, thus reaching each of the first to seventh gaps 81 to 87 (recessed portions 61a, 61b).

It is to be noted here that the height of an end face 3ab of the sidewall 3a of the case 3 from a bottom face 33c of the recessed portion 33 is smaller than the height of an end face 93a in an area not including the fastening part 93 for the screw 9, so that the sixth gap 86 is formed between the end face 3ab and a bottom face 61ac of the recessed portion 61a. However, the cover-side end face 93a of the fastening part 93 needs to abut on the bottom face 61ac of the groove 61a of the cover 6, thus having no sixth gap 86. For this reason, it is difficult to allow the waterproofing adhesive 8 to flow into the outer periphery of the fastening part 93 in the recessed portion 61a when the case 3 and the cover 6 are mounted to each other. Accordingly, the portion of the groove 61a that is on the outer periphery of the fastening part 93 for the screw 9 has the waterproofing adhesive 8 applied as mentioned above. However, the waterproofing adhesive 8 applied to the portion of the groove 61a that is on the outer periphery of the fastening part 93 and the adhesive flowing out from the sixth gap 86 need to loin sufficiently to allow the waterproofing adhesive 8 to exhibit waterproofness.

In the present embodiment, the notches (communicating parts) 65 are formed in the vicinity of the fastening part 93 for communication between the grooves 61a, 61b, so that the waterproofing adhesive 8 flows easily toward the outer periphery of the fastening part 93 in the recessed portion 61a through the notches 65. Consequently, the waterproofing adhesive 6 applied to the portion of the groove 61a that is on the outer periphery of the fastening part 93 and the adhesive flowing out from the sixth gap 86 can join sufficiently, thereby allowing the waterproofing adhesive 8 to positively exhibit the waterproofness.

It is to be noted that "waterproof" means sealing against fluid which is not limited to "water" alone and thus, has fluid tightness.

As shown in FIG. 5A, the cover 6 is formed with, at its corner, a through hole 91 through which the screw 9 is passed, and a projection (positioning part) 71 is provided in the vicinity of the through hole 91 for accurate positioning of the cover 6 and the case 3. On the other hand, as shown in FIG. 5B, the case 3 is formed with, at its corner corresponding to the corner of the case 6, a tapped hole (a hole with an engraved thread groove) 92 into which the screw 9 is threaded, and a positioning recessed part (positioning part) 72 in which the projection 71 engages is provided in the vicinity of the tapped hole 92. The through hole 91 or the tapped hole 92 may be provided in either of the case 3 and the cover 6, and the positioning projection 71 or the positioning recessed part 72 may be provided on either of the case 3 and the cover 6. In this embodiment, the projection 71 and the recessed part 72 are used as a means of positioning the cover 6 and the case 3; however, another means may be used. The point is that it is necessary for the cover 6 and the case 3 to be positioned accurately by bringing the positioning part of the cover 6 and the positioning part of the case 3 into abutting relationship and for the waterproof structural section to have the above-mentioned gaps 81 to 87.

Except for the above, the structure of the present embodiment is basically similar to that of the first embodiment. The structure described in this embodiment is an applicable technique common to the first to fourth embodiments and can be combined with each or at least one of the first to fourth embodiments.

Sixth Exemplary Embodiment

Figure 6:
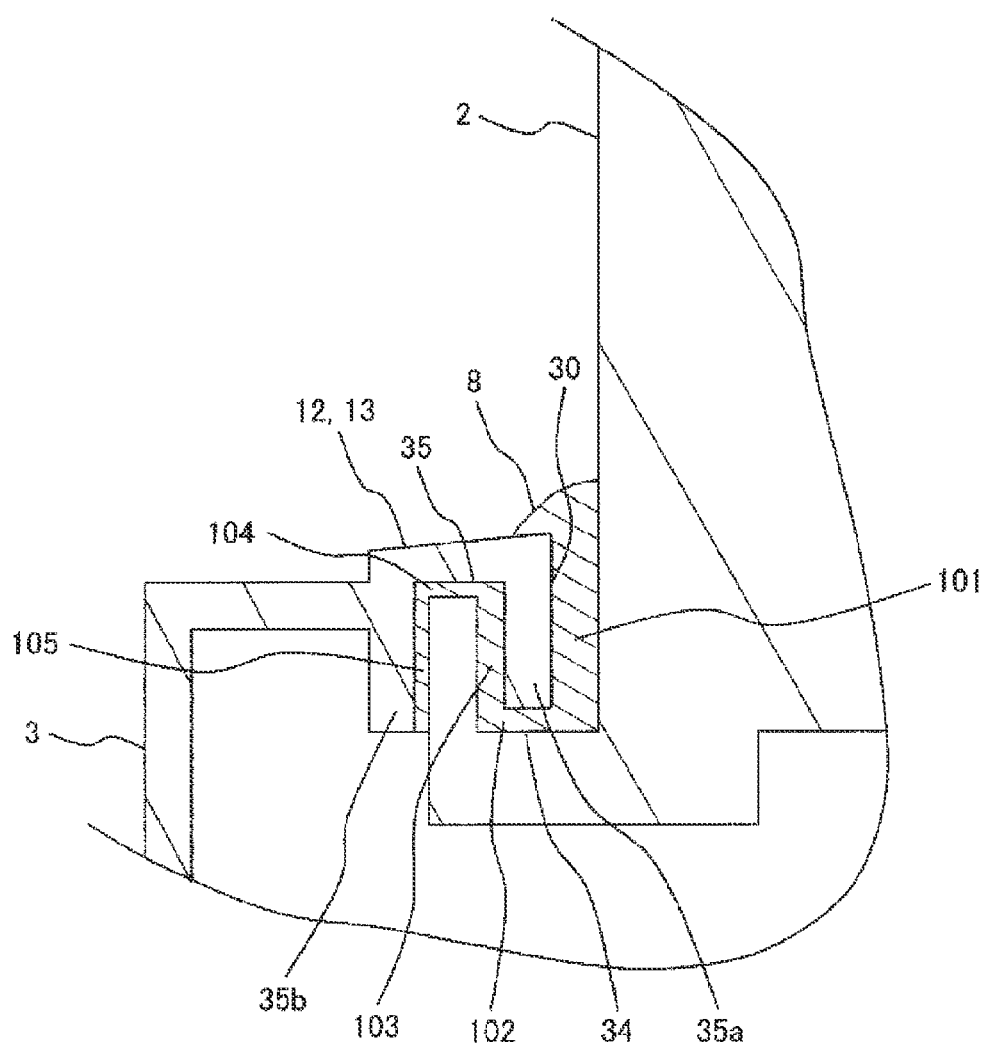
FIG. 6 is a sectional view of a structure in accordance with a sixth exemplary embodiment of the invention, illustrating the embodiment in which the invention is applied to a connector.

FIG. 6 is a sectional view in accordance with the sixth exemplary embodiment of the invention, illustrating the embodiment in which the invention is applied to a connector 2 used for connection with the outside. The basic structure of the present embodiment is similar to that described in the first embodiment, and this embodiment can be combined with each or at least one of the first to fifth embodiments.

In the present embodiment, a recessed portion (groove) 35 is provided along a periphery of an opening, which is formed in a case 3 for exposing the connector 2 to the outside. The recessed portion 35 is formed to take on a recessed form in a direction from the inside to the outs de of the case 3. A recessed portion (groove) 34 is provided along an outer periphery of the connector 2 and takes on a recessed form in a direction from the outside to the inside or the case 3.

A sidewall 35a of the recessed portion 35 that is positioned close to the center of the opening (an inward position in the opening) is inserted into the recessed portion 24 of the connector 2, whereby the recessed portions 35 and 34 form gaps 101 to 105 in labyrinth form. By being filled with a waterproofing adhesive 8, the gaps 101 to 105 are structurally fluid-tight, whereby a waterproof structural section is formed.

A back side of the recessed portion 35 in the waterproof structural section is formed with a projecting portion 12 formed to projectingly project outwardly of a control apparatus from a surface of the case. In this way, drainage to the outside is structurally facilitated when the control apparatus is wetted externally. The projecting portion 12 has an inclination 13 provided from a portion to which the waterproofing adhesive 8 is applied, thereby enhancing a drainage effect. In other words, the projecting portion 12 is slanted so that the sidewall 35a of the recessed portion 35 that is positioned close to the center of the opening is taller than a sideway 35b positioned externally of the opening.

In the above-described embodiments, the recessed portions 33 and 61 are not limited to the respective numbers described and may be increased in number. Instead of being formed of the two recessed portions 61a, 61b, the recessed portion 61 may be one recessed portion. Even in such a case, a gap formed by the recessed portions 33, 61 in labyrinth form provides communication between the inside and the outside of the casing and is filled with the waterproofing adhesive 8. To ensure long-term reliability of the waterproof structural section by increasing adhesive distance as well as to avoid unnecessary increases in surface area of the case 3 and the cover 6, it is preferable that as described above, one of the recessed portions 33, 61 of the case 3 and the cover 6 (the recessed portion 33 in the embodiments) is formed of one recessed portion (single row groove), while the other of the recessed portions 33, 61 (the recessed portion 61 in the embodiments) is formed of two recessed portions (two grooves in double row relationship).

It is to be noted that the present invention is not limited to the above-described embodiments and includes various modifications. For example, the embodiments are described in detail to explain the invention in an easily understood manner, so that the invention is not necessarily limited to include all the structures. One of the embodiments can partly be replaced by the structure of another embodiment, and the structure of one of the embodiments can be added to the structure of another embodiment. Moreover, the structure of each of the embodiments can partly have another structure as an addition and be deleted and replaced.

REFERENCE SIGNS LIST 1 substrate
1A electronic component
2 connector
3 case
3a sidewall
3ab leading end face
3b sidewall
3bb leading end face
3o opening
4 solder
5 substrate fixing screw
6 cover
6a sidewall
6b partition wall
6ba leading end face
6c sidewall
7 heat transfer member
8 waterproofing adhesive
9 screw
12 projecting portion
13 inclination
21 terminal
31 heat radiating fin
32 heat transfer boss
33 recessed portion
33a sidewall
33aa outer peripheral sidewall face
33b sidewall face
33ba inner peripheral sidewall face
33c bottom face
34 recessed portion (groove)
35 recessed portion (groove)
37 notch (forming uneven shape)
61, 61a, 61b recessed portion
61aa sidewall face
61ab sidewall face
61ac bottom face
61ba sidewall face
61bb sidewall face
61bc bottom face
81 first gap
82 second gap
83 third gap
84 fourth gap
85 fifth gap
86 sixth gap
87 seventh gap
64 notch (forming uneven shape)
65 notch (communicating part)
71 positioning projection (positioning part)
72 positioning recessed part (positioning part)
91 through hole
92 tapped hole
93 fastening part for screw 9

The invention claimed is:

1. A motor vehicle internal combustion engine control apparatus comprising:
   a substrate formed with an electronic circuit for controlling a motor vehicle internal combustion engine;
   a connector for connecting the electronic circuit formed on the substrate to an external device;
   a case for covering one substrate surface of the substrate;
   a cover for covering the other substrate surface of the substrate; and a waterproofing adhesive adhering to a junction part between the cover and the case, wherein the case and the cover each include at least one recessed portion at the junction part, wherein a sidewall of one of the recessed portions is inserted into the other recessed portion to form a gap folded a plurality of times between the case and the cover, wherein the gap extends between an inside, which is separated from an outside by the case and the cover, and the outside and is formed to have, compared with a gap size thereof at a point, a larger gap size externally of the point, and wherein the gap is filled with the waterproofing adhesive to be fluid-tight.

2. The motor vehicle internal combustion engine control apparatus according to claim 1, wherein:

among the inserted sidewall and sidewalls of the recessed portions of the cover and the case, the two sidewalls have mutually facing sidewall faces slanted in a same direction; and the direction in which the respective sidewall faces of the two sidewalls are slanted is such a direction that in a path of the gap extending between the inside and the outside for connection between the inside and the outside, a gap defined by the sidewall faces has an outer end positioned away from the inside as compared with an inner end thereof.

3. The motor vehicle internal combustion engine control apparatus according to claim 1, wherein an end face of the sidewall of the one of the recessed portions of the cover and the case that faces a bottom surface of the other recessed portion includes a notch.

4. The motor vehicle internal combustion engine control apparatus according to claim 1, wherein:

the sidewall of the at least one of the recessed portions of the cover and the case includes a screw fastening part for fixing the cover and the case; and the screw fastening part includes on one of a side thereof and both sides thereof a notch for disconnecting the sidewall.

5. The motor vehicle internal combustion engine control apparatus according to claim 1, wherein:

the case comprises an opening for exposing the connector to the outside; a recessed portion formed along a periphery of the opening and taking on a recessed form in a direction toward the outside; and a projecting portion formed at a back side of the recessed portion, which is formed in the recessed form along the opening, to project from a surface of the case;

the connector includes a recessed portion, which is formed along an outer periphery thereof and takes on a recessed form in a direction toward the inside; and a sidewall of the recessed portion formed along the opening is positioned close to a center of the opening and inserted into the recessed portion of the connector.

6. The motor vehicle internal combustion engine control apparatus according to claim 5, wherein the projecting portion is slanted so that the sidewall of the recessed portion formed along the opening that is positioned close to the center of the opening is taller than a sidewall of the recessed portion formed along the opening that is positioned externally of the opening.

7. The motor vehicle internal combustion engine control apparatus according to claim 1, wherein:

the case includes the recessed portion at the junction part;

the cover includes the two recessed portions in double row relationship at the junction part;

the sidewall and a sidewall that define the recessed portion of the case are inserted separately into the respective two recessed portions of the cover that have the double row relationship; and the waterproofing adhesive is filled over an entire range of the gap where an inner surface of the two recessed portions of the cover that have the double row relationship faces a face of the case.

* * * * *